(12) United States Patent
Vaysset et al.

(10) Patent No.: US 10,593,414 B2
(45) Date of Patent: *Mar. 17, 2020

(54) METHOD OF PROPAGATING MAGNETIC DOMAIN WALL IN MAGNETIC DEVICES

(71) Applicants: IMEC VZW, Leuven (BE); Katholieke Universiteit Leuven, KU LEUVEN R&D, Leuven (BE)

(72) Inventors: Adrien Vaysset, Leuven (BE); Odysseas Zografos, Leuven (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

This patent is subject to a terminal disclaimer.

(21) Appl. No.: 16/155,158

(22) Filed: Oct. 9, 2018

(65) Prior Publication Data
US 2019/0043598 A1 Feb. 7, 2019

Related U.S. Application Data

(63) Continuation-in-part of application No. 15/807,464, filed on Nov. 8, 2017, now Pat. No. 10,236,046.

(30) Foreign Application Priority Data

Nov. 9, 2016 (EP) ..................... 16197857

(51) Int. Cl.
*G11C 11/16* (2006.01)
*G11C 19/08* (2006.01)
*G11C 5/06* (2006.01)

(52) U.S. Cl.
CPC .......... *G11C 19/0841* (2013.01); *G11C 5/063* (2013.01); *G11C 11/1673* (2013.01); *G11C 11/1675* (2013.01)

(58) Field of Classification Search
CPC . G11C 19/0841; G11C 5/063; G11C 11/1673; G11C 11/1675
(Continued)

(56) References Cited

U.S. PATENT DOCUMENTS 6,834,005 B1    12/2004   Parkin
9,979,402 B2 *   5/2018   Vaysset .................. H01L 43/08
(Continued)

FOREIGN PATENT DOCUMENTS

JP     2006196708 A   *   7/2006

OTHER PUBLICATIONS

Phung, Timothy et al., "Highly Efficient In-Line Magnetic Domain Wall Injector", NANO Letters, vol. 15 (2), 2014, 7 pages.
(Continued)

*Primary Examiner* — Viet Q Nguyen
(74) *Attorney, Agent, or Firm* — McDonnell Boehnen Hulbert & Berghoff LLP

(57) ABSTRACT

The disclosed technology generally relates to magnetic devices, and more particularly to magnetic devices configured to generate a stream of domain walls propagating along an output magnetic bus. In an aspect, a magnetic device includes a magnetic propagation layer, which in turn includes a plurality of magnetic buses. The magnetic buses include at least a first magnetic bus, a second magnetic bus, and an output magnetic bus configured to guide propagating magnetic domain walls. The magnetic propagation layer further comprises a central region in which the magnetic buses converge and are joined together. In another aspect, a method includes providing the magnetic device and generating the stream of domain walls propagating along the output magnetic bus.

20 Claims, 13 Drawing Sheets

(58) Field of Classification Search
USPC .......................................................... 365/171
See application file for complete search history.

(56) References Cited

U.S. PATENT DOCUMENTS

| | | | | |
|---|---|---|---|---|
| 10,164,077 B2* | 12/2018 | Vaysset | .................. | B82Y 10/00 |
| 10,236,046 B2* | 3/2019 | Vaysset | .................. | G11C 11/16 |
| 10,269,402 B2* | 4/2019 | Andrikopoulos | ... | G11C 11/1673 |

OTHER PUBLICATIONS

O'Brien, L., et al. "Domain Wall Interactions at a Cross-Shaped Vertex." Phil. Trans. R. Soc. A, vol. 370, 2012, pp. 5794-5805.

Sethi, P. et al., "In-Plane Current Induced Domain Wall Nucleation and its Stochasticity in Perpendicular Magnetic Anisotropy Hall Cross Structures", Applied Physics Letters, vol. 107, 2015, pp. 192401-1-192401-5.

* cited by examiner

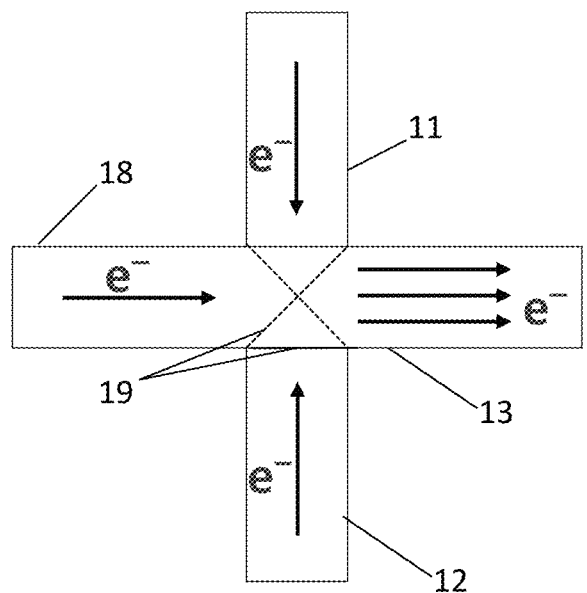
FIG 6
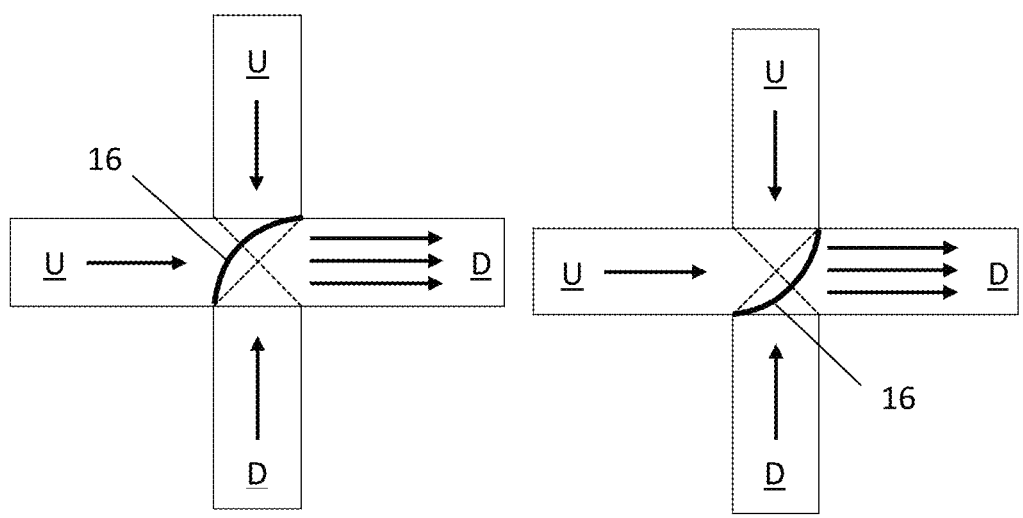
FIG 7  FIG 8

| | | | | | | | | |
|---|---|---|---|---|---|---|---|---|
| | D (DW 2304) | D | D | U (DW 2308) | U | D | U | U |
| | Input 1 (2302) | Input 2 | Input 1 | Input 2 (2306) | Input 1 | Input 2 | Input 1 | Input 2 |
| | D | D | U | U | D | D | U | U |
| | D | D | D | D | U | U | U | U |

FIG 24

METHOD OF PROPAGATING MAGNETIC DOMAIN WALL IN MAGNETIC DEVICES

CROSS-REFERENCE TO RELATED APPLICATIONS

This patent application is a continuation-in-part application that claims priority to European Patent Application No. EP 16197857.2, filed Nov. 9, 2016 and United States Patent Publication No. 2018/0130510 A1, filed Nov. 8, 2017, the contents of which are incorporated by reference herein in their entirety.

BACKGROUND

Field

The disclosed technology generally relates to magnetic devices, and more particularly to magnetic devices configured to generate a stream of domain walls.

Description of the Related Technology

Some storage devices including hard-disk drives and magnetic random access memory (MRAM) devices utilize magnetic domains to store information. When such magnetic domains are formed in a magnetic strip, they can be shifted along the magnetic strip, for example by applying a spin transfer torque (STT) or spin-orbit torque (SOT). Thus, information encoded in the magnetic domains can be propagated along an elongated magnetic carrier. This induced domain wall (DW) motion may have various applications, including applications in logic and memory devices.

A domain wall memory device, e.g., memory device referred to as racetrack memory device, is a non-volatile memory device that can potentially provide high storage densities, e.g., densities comparable to those of conventional magnetic disk drives, as well as providing high data throughput in read and write operations, e.g., throughputs including read and write speeds that are comparable to or faster those of some dynamic random access memory (DRAM) devices. In a domain wall memory device, e.g., a racetrack memory device, a spin-coherent electric current may be used to move a sequence of magnetic domains through a substrate, e.g., along a magnetic bus, e.g., along a permalloy wire. Read/write elements may be provided at predetermined positions near the substrate to encode or decode the sequence of magnetic domains in the form of a data stream. Advantageously, high bit densities can be achieved by using state-of-the-art spintronic devices to detect and/or manipulate particularly small magnetic domains.

In some configurations, a domain wall memory may, for example, comprise a plurality of flat magnetic buses, e.g., flat wires, arranged in a grid with read and write heads arranged nearby. In some other configurations, a U-shaped wire may be arranged vertically over a read/write head on an underlying substrate, e.g., to provide a small footprint on the substrate on which the read/write head is provided.

For example, such a domain wall memory is described in U.S. Pat. No. 6,834,005, which discloses a shift register that uses the inherent, natural properties of domain walls in magnetic materials to store data. This shift register uses spin electronics without changing the physical nature of its constituent materials. The shift register comprises a fine track or strip of magnetic materials. Information is stored as domain walls in the track. An electric current can be applied to the track to move the magnetic moments along the track past a reading or writing device, e.g., a magnetic read/write head. In a magnetic material with domain walls, a current passed across the domain wall may move the domain wall in the direction of the current flow. As the electrons pass through a domain, they can become spin polarized. When these spin polarized electrons pass through the next domain and across a domain wall, they exert a spin torque on the magnetization. This spin torque moves the domain wall. Thus, the data stored within the magnetic domains is shifted as a function of the direction of the electric current. While the current is applied, the magnetic domains may pass by the magnetic read/write head that is arranged in close proximity to the track, such that the magnetic domains may be altered to record a data stream or may be detected to recover the data stream.

Domain wall motion, as experimentally demonstrated in the art, may be typically created by the application of a magnetic field. This approach has some disadvantages, including a relatively large current that may be needed to generate the magnetic field, which may render the devices difficult to scale down. However, Phung et al. disclosed, in "Highly efficient in-line magnetic domain wall injector", Nano Letters 15 (2), pp. 835-841, a method of injecting a domain wall without using an external magnetic field. In this method, a small in-plane region is created at the end of a perpendicularly magnetized strip. Then, an in-plane current is applied. The spin polarization induced by the in-plane region generates a spin torque on the perpendicular magnetization nearby. A domain wall is thus injected without using an external magnetic field. The in-plane region may for example be created by ion irradiation, voltage-controlled anisotropy or ion etching. However, such processes may be precisely controlled to avoid large variability between devices. Moreover, additional constraints may be introduced to the process flow by such process steps, and an increase in cost may be implied by these process steps.

SUMMARY

It is an object of embodiments of the disclosed technology to provide good and efficient methods for generating a stream of domain walls propagating along a magnetic bus, e.g., for recording data in a domain wall memory.

The above objective is accomplished by a method according to the disclosed technology.

In some embodiments of the disclosed technology, domain walls can be injected in a magnetized material without requiring an external magnetic field during operation, e.g., without relying on Oersted field. Particularly, while input domains may be initialized using the Oersted field, the application of a field to nucleate domain walls may not be used to write data to a racetrack memory after the input domains have been initialized, according to embodiments.

In some embodiments of the disclosed technology, domain walls can be injected in a perpendicularly magnetized material without requiring an in-plane magnetized region in the perpendicularly magnetized material.

In some embodiments of the disclosed technology, domain walls can be injected in a magnetized material in a simple to implement and efficient manner.

In some embodiments of the disclosed technology, any sequence of bits, e.g., a freely selectable sequence, can be converted into a stream of magnetic domains on a racetrack memory.

In some embodiments of the disclosed technology, a low-current and energy efficient method of generating a stream of magnetic domains on a racetrack memory is provided. Additionally, instead of nucleating a new domain wall for each magnetic domain transition in a data sequence, e.g., a freely selectable bit sequence, being written to a racetrack memory, a previously initialized domain wall can be expanded and reused, thus achieving improved energy efficiency and/or allowing a low-current implementation.

In a first aspect, the disclosed technology provides a method of generating a stream of domain walls propagating along an output magnetic bus. The method comprises providing a device that comprises a magnetic propagation layer. The magnetic propagation layer comprises a plurality of magnetic buses for guiding propagating magnetic domain walls along a longitudinal direction, or in a direction perpendicular to layer normal direction, of the magnetic bus. The magnetic propagation layer further comprises a region in which the magnetic buses converge and are joined together. This region may be a convex region. This region may be an intersection in which the plurality of magnetic buses converge and are joined together. The plurality of magnetic buses comprises at least a first magnetic bus and a second magnetic bus having an opposite magnetization component with respect to each other such that a domain wall separating the opposite magnetization states is pinned in the region in which the plurality of magnetic buses converge and are joined together. The plurality of magnetic buses further comprises the output magnetic bus serving as an output for the stream of domain walls.

The method also comprises generating the stream of domain walls propagating along the output magnetic bus by applying spin orbit torques and/or spin transfer torques to the pinned domain wall such as to alternate the pinned domain wall between two stable configurations, in which each stable configuration corresponds to a different magnetization state of the output magnetic bus in at least a region where the output magnetic bus is joined to the region in which the plurality of magnetic buses converge and are joined together.

A method in accordance with embodiments of the disclosed technology may further comprise initializing at least the first magnetic bus and the second magnetic bus of the plurality of magnetic buses in the opposite magnetization states with respect to each other.

In a method in accordance with embodiments of the disclosed technology, the step of initializing may further comprise initializing at least a further magnetic bus to either of the opposite magnetization states.

In a method in accordance with embodiments of the disclosed technology, the step of applying the spin transfer torque may comprise applying an in-plane current between the output magnetic bus, on one hand, and the first magnetic bus and/or the second magnetic bus, on the other hand, such as to establish at least one current path through the region, in which the plurality of magnetic buses converge and are joined together, toward the output magnetic bus.

In a method in accordance with embodiments of the disclosed technology, the step of applying the in-plane current may comprise selecting either the first magnetic bus or the second magnetic bus for injecting the in-plane current, in which this selection may be determined by a data bit in a data bit sequence for converting into the stream of domain walls.

In a method in accordance with embodiments of the disclosed technology, the step of applying the in-plane current may comprise applying a first in-plane current between the output magnetic bus and the first magnetic bus and simultaneously applying a second in-plane current between the output magnetic bus and the second magnetic bus, to create an oscillation between the two stable configurations, thereby periodically generating a domain wall between opposite magnetization states that propagates down the output magnetic bus.

In a method in accordance with embodiments of the disclosed technology, providing the device may comprise providing the device in which the first magnetic bus and the second magnetic bus are tapered, e.g., have a decreasing width in the direction toward the region in which the plurality of magnetic buses converge and are joined together.

A method in accordance with embodiments of the disclosed technology may further comprise using the output magnetic bus as a racetrack data memory.

In a method in accordance with embodiments of the disclosed technology, providing the device may comprise providing the device wherein the region in which the plurality of magnetic buses converge and are joined together has a convex shape, e.g., a convex polygonal shape.

In a method in accordance with embodiments of the disclosed technology, providing the device may comprise providing the device, wherein each edge of the convex shape, e.g., of the convex polygonal shape, is formed by an end region of a corresponding magnetic bus of the plurality of magnetic buses and wherein each corner of the convex shape is shared with two adjacent magnetic buses of the plurality of magnetic buses.

In a method in accordance with embodiments of the disclosed technology, providing the device may comprise providing the device wherein a plurality of configurations of locally minimal energy for a domain wall correspond to line segments connecting corners of the region in which the plurality of magnetic buses converge and are joined together.

In a method in accordance with embodiments of the disclosed technology, the domain wall in the region, in which the plurality of magnetic buses converge and are joined together, may alternate between the two stable configurations, wherein each stable configuration corresponds to one of the plurality of configurations of locally minimal energy.

In a method in accordance with embodiments of the disclosed technology, providing the device may comprise providing the device wherein the plurality of magnetic buses is arranged in a star configuration around the region in which the plurality of magnetic buses converge and are joined together, each magnetic bus extending radially outward from the region in which the plurality of magnetic buses converge and are joined together.

In a method in accordance with embodiments of the disclosed technology, providing the device may comprise providing the device wherein the plurality of magnetic buses is arranged to form a triangular shape of three magnetic buses extending outward from a triangular region in which the plurality of magnetic buses converge and are joined together.

In a method in accordance with embodiments of the disclosed technology, providing the device may comprise providing the device wherein the plurality of magnetic buses is arranged to form a cross shape of four magnetic buses extending outward from a square region in which the plurality of magnetic buses converge and are joined together.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 6 shows another device that may be provided in a method in accordance with embodiments of the disclosed technology.

FIG. 7 to FIG. 16 illustrate, chronologically, the periodic generation of domain walls propagating down the output magnetic bus in a device as shown in FIG. 6, due to an oscillation that is generated by a method in accordance with embodiments of the disclosed technology.

FIG. 24 illustrates a logic diagram corresponding to operation of a device as shown in FIG. 21 or FIG. 22.

Figure 1:
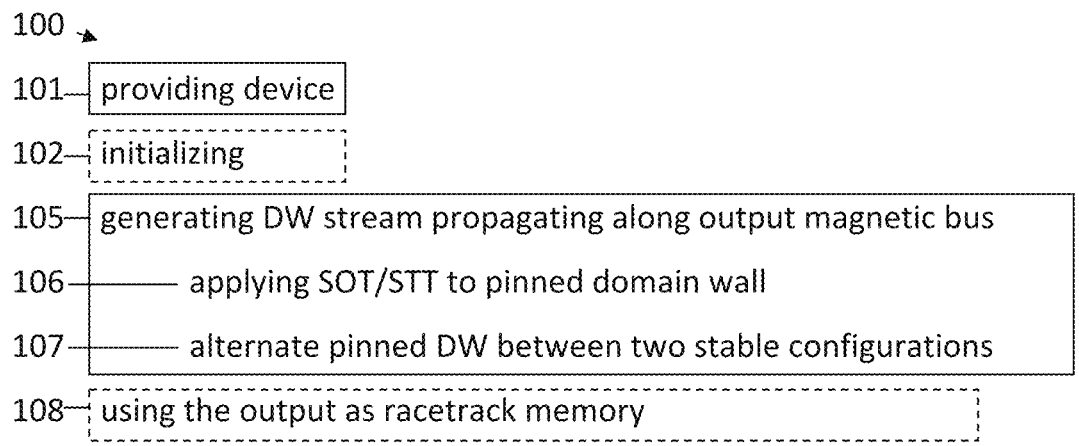
FIG. 1 illustrates an exemplary method in accordance with embodiments of the disclosed technology.

The drawings are only schematic and are non-limiting. In the drawings, the size of some of the elements may be exaggerated and not drawn on scale for illustrative purposes.

Any reference signs in the claims shall not be construed as limiting the scope to the illustrated feature.

In the different drawings, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, the disclosed technology relates to a method of generating a stream of domain walls propagating along a magnetic bus, e.g., for recording data in a domain wall memory, e.g., for writing, erasing or programming data to a domain wall racetrack memory. The method comprises providing a device comprising a magnetic propagation layer that comprises a plurality of magnetic buses for guiding propagating magnetic domain walls along a longitudinal direction of the magnetic bus. The magnetic propagation layer comprises a region, e.g., an adjoining region, in which the plurality of magnetic buses converge and are joined together, e.g., a central region in which the plurality of magnetic buses converge and are joined together. As described herein, a central region refers to a region of convergence of the magnetic buses in this convex region, and does not necessarily refer to or limit to a geometrically central location of the convex region. As described herein, a convex region refers to a polygonal region having each of the interior angles that are less than 180°. The central region may, for example, be an intersection in which the plurality of magnetic buses converge and are joined together, which may or may not be formed at a geometric central location. The plurality of magnetic buses comprises at least a first magnetic bus and a second magnetic bus having an opposite magnetization orientation with respect to each other. According to embodiments, the first and second magnetic buses having the opposite magnetization orientation with respect to each other can have magnetization vectors, e.g., average or net magnetization vectors, that form an angle in the range of about 135° to about 180° with respect to each other, in the range of 160° to 180°, in the range of about 170° to about 180°, or in a range defined by any of these values, e.g., substantially about 180°. Thus, a domain wall separating the opposite magnetization states is pinned in the central region. The plurality of magnetic buses further comprises an output magnetic bus, e.g., a third magnetic bus, serving as an output for the stream of domain walls. As described herein, a pinned domain wall refers to the domain wall being in a local energy minimum, e.g., due to a configuration of the domain wall in the region in which the plurality of magnetic buses converge and are joined together that is energetically lower with respect to other configurations in a local neighborhood of this configuration.

The method also comprises generating a stream of domain walls that propagate along the output magnetic bus by applying spin orbit torques and/or spin transfer torques to the pinned domain wall such as to alternate, e.g., to switch, the pinned domain wall between two stable configurations, in which each stable configuration corresponds to a different magnetization state of the output magnetic bus.

Referring to FIG. 1, an exemplary method 100 in accordance with embodiments of the disclosed technology is illustrated. This method 100 is adapted for generating a stream of domain walls propagating along a magnetic bus, i.e. along the output magnetic bus referred to further hereinbelow.

Figure 2:
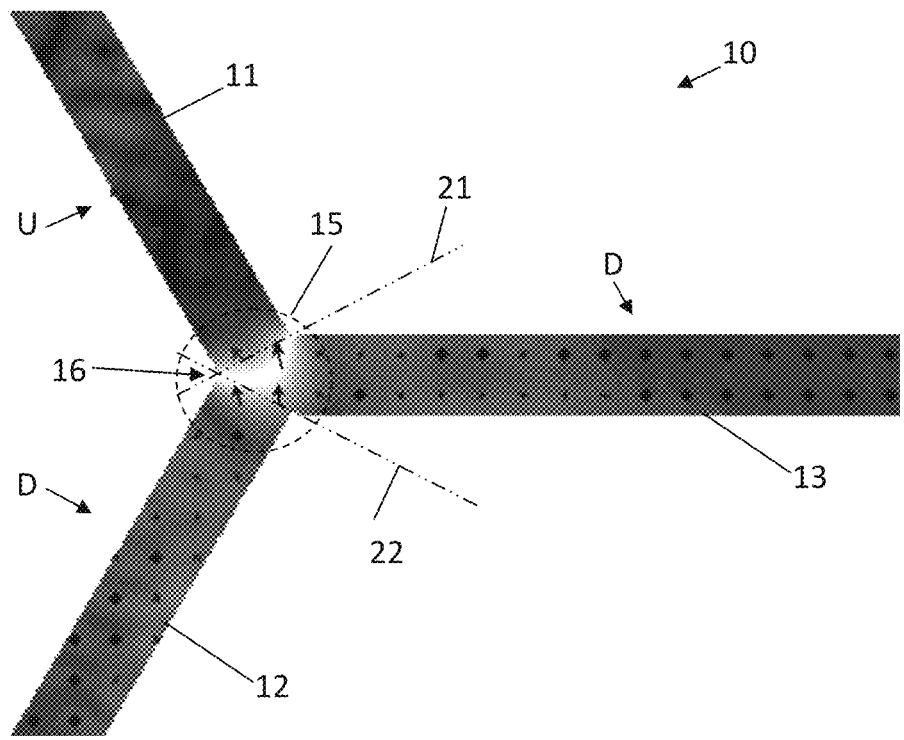
FIG. 2 shows a device that may be provided in a method in accordance with embodiments of the disclosed technology.

The method 100 comprises providing 101 a device, e.g., a domain wall injector device, comprising a magnetic propagation layer. For example, an example of such device 10 is schematically illustrated in FIG. 2. The magnetic propagation layer may comprise a magnetic material adapted for allowing the propagation of magnetic domain walls, including a ferromagnetic and/or antiferromagnetic material, or a composite material formed by constituent ferromagnetic and/or antiferromagnetic materials. The magnetic propagation layer may be perpendicularly or in-plane magnetized with respect to a lateral direction parallel to a major surface of the magnetic propagation layer or a substrate.

The magnetic propagation layer comprises a plurality of magnetic buses 11, 12, and 13 for guiding propagating magnetic domain walls along a longitudinal direction or an in-plane direction of the magnetic bus. In the illustrated, the magnetic buses 11, 12, and 13 are configured as elongated magnetized structures, such as strips or wires, e.g., nanostrips or nanowires, formed in the magnetic propagation layer.

The magnetic propagation layer also comprises a central region 15 in which the plurality of magnetic buses converge and are joined together. Here, the term central region refers to a region that serves as a junction connecting the magnetic buses, and thus refers to a topologically central region with respect to the plurality of magnetic buses. That is, a central region does not necessarily refer to or limit to a geometrically central location.

According to some embodiments, the central region 15 has a convex shape, such as a regular polygonal shape. In embodiments according to the disclosed technology, each edge of such convex shape, e.g., regular polygonal shape, may, for example, be formed by an end region of a corresponding magnetic bus of the plurality of magnetic buses. Each corner of such convex shape, e.g., regular polygonal shape, may be shared with two adjacent magnetic buses of the plurality of magnetic buses. The plurality of magnetic buses may be arranged in a star configuration around the central region, e.g., such that each magnetic bus extends radially outward from the central region, for example to form a cross shape of four magnetic buses extending outward from a square central region, such as shown in FIG. 6. Thus, the device may be formed by two magnetic strips crossing each other in the central region. It may be an advantage of such embodiments that arranging the magnetic buses in a cross pattern may be efficient and easy to manufacture. The plurality of magnetic buses may also be arranged such as to form a triangular shape of three magnetic buses extending outward from a triangular central region, e.g., as shown in FIG. 2. For example, the triangular central region may be an isosceles triangular central region, e.g., an equilateral triangular central region.

While reference was made hereinabove to a regular polygonal shape of the central region and a radial star pattern of the magnetic buses around the central region, embodiments of the disclosed technology are not necessarily limited thereto.

Figure 18:
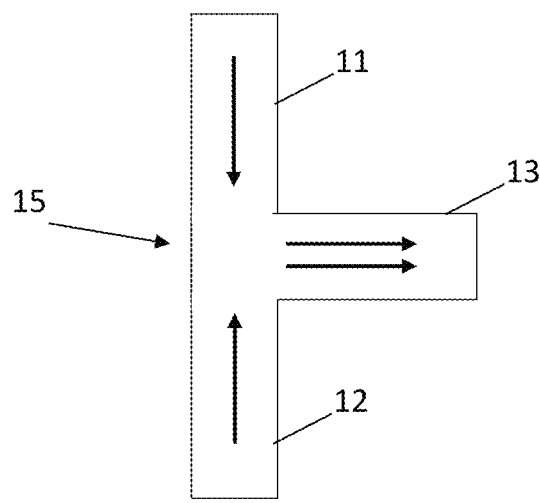
FIG. 18 shows another device that may be provided in a method in accordance with embodiments of the disclosed technology.
Figure 19:
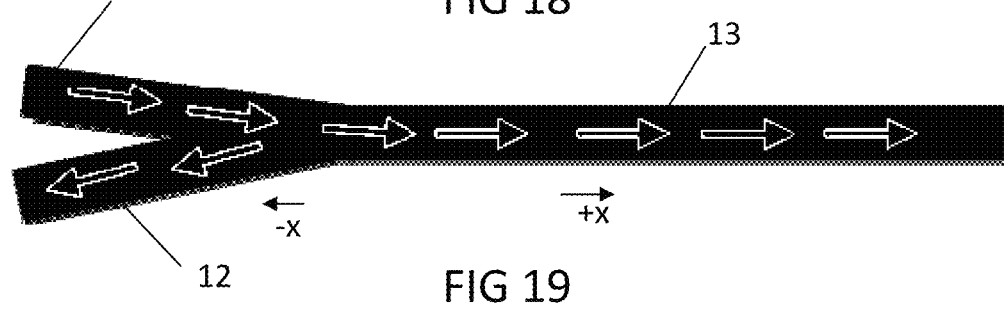
FIG. 19 illustrates yet another device that may be provided in a method in accordance with embodiments of the disclosed technology.

Furthermore, the magnetic buses may be uniformly angularly spaced around the central region, e.g., as illustrated by the triangular configuration of FIG. 2 and the cross-shaped configuration of FIG. 6, or may be non-uniformly spaced around the central region, e.g., such as the T-junction configuration shown in FIG. 18 or the acute angle junction shown in FIG. 19.

According to embodiments, at least two, e.g., a first magnetic bus 11 and a second magnetic bus 12, of the plurality of magnetic buses have different, e.g., opposite, magnetization orientations, e.g., opposite transverse magnetization orientations or opposite in-plane magnetization orientations, with respect to each other such that a domain wall 16, separating the opposite magnetization states of the first magnetic bus 11 and the second magnetic bus 12, is pinned in the central region 15. The plurality of magnetic buses also comprises an output magnetic bus 13 serving as an output for the stream of domain walls. According to embodiments, at least one magnetic bus, e.g., at least one input magnetic bus such as one of the first and second magnetic buses 11, 12, different from the output magnetic bus 13, may have an 'UP' transverse magnetization state, and at least one magnetic bus, e.g., at least one input magnetic bus such as the other of the first and second magnetic buses 11, 12, different from the output magnetic bus 13, may have a 'DOWN' transverse magnetization state.

However, embodiments of the disclosed technology are not necessarily limited to different or opposite perpendicular magnetization states. For example, at least a first magnetic bus 11 and a second magnetic bus 12 of the plurality of magnetic buses may have different or opposite in-plane magnetization states with respect to each other such that a domain wall 16, separating the magnetization states of the first magnetic bus 11 and the second magnetic bus 12, is pinned in the central region 15. For example, as shown in FIG. 19, a first magnetic bus 11 may have a +x in-plane magnetization component, and a second magnetic bus 12 may have a −x in-plane magnetization component. For example, the in-plane magnetization states may have a component, e.g., an x-component, of opposite signs, e.g., −x and +x, with respect to each other. For example, this component may be substantially oriented along the orientation of the output magnetic bus 13. For example, each of the first magnetic bus and the second magnetic bus may be oriented at a small angle with respect to this orientation, e.g. an angle in the range of 5° to 45°, in the range of 5° to 30°, in the range of 10° to 20°, or in a range defined by any of these values.

For example, the central region 15 may have a convex or a polygonal shape, and each corner of this convex shape may lie in between two adjacent magnetic buses of the plurality of magnetic buses. Thus, a plurality of configurations of local energy minima for a propagating domain wall may correspond to line segments 19 connecting corners of the central region, e.g., to edges and/or diagonals of the convex shape, such as shown in FIG. 6. Thus, the device may be preset or initialized in a magnetic configuration such that a domain wall is present in the central region. This domain wall may be stable when substantially aligned along one of the diagonals or edges of the convex or polygonal shape. For example, in the example shown in FIG. 2, a stable configuration of the domain wall may correspond to the edge 21, where the first magnetic bus 11 transitions into the central region 15, if the output magnetic bus 13 and the second magnetic bus 12 have the same magnetic orientation. Another stable configuration may correspond to the edge 22, where the second magnetic bus 12 transitions into the central region 15, if the output magnetic bus 13 and the first magnetic bus 11 have the same magnetic orientation.

The stable configurations, referred to in present description, e.g., formed along diagonals and/or edges of the convex or polygonal shaped central region, may correspond to pinning sites for domain walls, where a magnetic domain wall may be pinned, e.g., "trapped", in a local energy minimum until it is released by a driving force, e.g., by a torque exerted on the domain wall.

Figure 20:
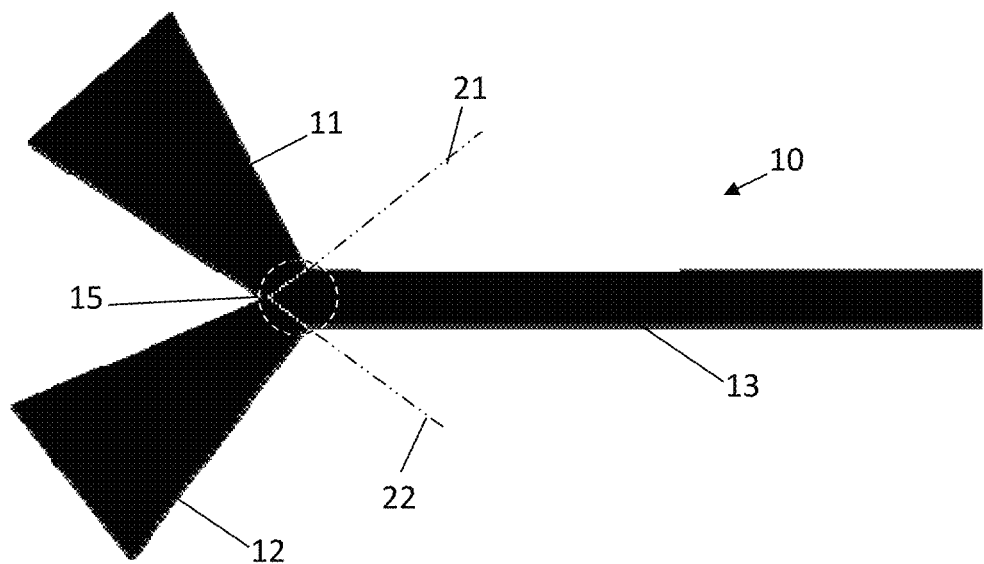
FIG. 20 illustrates a further exemplary device that may be provided in a method in accordance with embodiments of the disclosed technology.

Furthermore, the first magnetic bus 11 and the second magnetic bus 12 (and, optionally, a further magnetic bus 18 in FIGS. 6 to 16) may be tapered, e.g., may have a decreasing width in the direction toward the central region, such as shown in FIG. 20. It is an advantage of such tapered shape that the stable configurations referred to hereinabove may be characterized by a sharp and well-defined local energy minimum. For example, the tapered shape may cause a steeper energy gradient with respect to displacements of the stable configuration, e.g., of the pinned domain wall in the central region, as compared to such energy gradient in the absence of the tapered shape. Particularly, when considering an infinitesimal displacement, toward and/or into the tapered magnetic bus, of a domain wall pinned in such stable configuration, the energy cost of this virtual displacement may be higher than in the case where the magnetic bus would have a constant width and/or a constant cross-section.

Thus, a pinned domain wall may be better constrained in the central region, e.g., may be prevented from wandering into an input magnetic bus 11, 12, and 18 due to the energetically less favorable configuration corresponding to a wider domain wall cross-section in the magnetic bus than in the stable configuration in the central region.

Referring back to FIG. 1, the method 100 may comprise initializing 102 at least the first magnetic bus 11 and the second magnetic bus 12 of the plurality of magnetic buses in opposite magnetization states with respect to each other, such that a domain wall 16, separating the opposite magnetization states of the first magnetic bus 11 and the second magnetic bus 12, is pinned in the central region 15. At least a further magnetic bus 18 may also be initialized to either magnetization state when the device is configured according to FIGS. 6-16. For example, at least one magnetic bus, e.g., at least one input magnetic bus, e.g., one of the first and second magnetic buses 11, 12, different from the output magnetic bus 13, may be initialized to an 'UP' transverse magnetization state, and at least one input magnetic bus, e.g., the other of the first and second magnetic buses 11, 12, different from the output magnetic bus 13, may be initialized to a 'DOWN' transverse magnetization state. For initializing the magnetic buses, a suitable method may be used, e.g., magnetic fields may be applied to induce the different magnetization states. It is an advantage of embodiments of the disclosed technology, that, once initialized, a stream of magnetic domains, e.g., separated by transitory domain walls, can be generated and transmitted over the output magnetic bus without requiring the application of external magnetic fields. Thus, each magnetic domain in such stream of magnetic domains may be generated as having an arbitrary length.

For example, as shown in FIG. 6, the device may be preset or initialized in a magnetic configuration such that a domain wall is present in the central region. This domain wall may be stable when substantially aligned along one of the diagonals or edges of the convex shape. For example, in the exemplary geometry shown in FIG. 6, this stable configuration may correspond to a diagonal of the square central region defined by central edges of each of the magnetic buses 11, 12, 13 and 18, if the further magnetic bus 18 has a first magnetization state corresponding to that of either the first 11 or the second magnetic bus 12, and the output magnetic bus 13 has a second magnetization state corresponding to that of the other one of the first or the second magnetic bus. Likewise, a stable configuration may correspond to an edge of the square region if three of the four exemplary magnetic buses share the same magnetization state, and the fourth one is in the opposite magnetization state.

Referring back to FIG. 1, the method 100 further comprises generating 105 a stream of domain walls that propagate along the output magnetic bus 13 by applying 106 spin orbit torques and/or spin transfer torques to the pinned domain wall such as to switch 107 the pinned domain wall between two stable configurations, in which each stable configuration corresponds to a different transverse magnetization state of the output magnetic bus. For example, in the example shown in FIG. 2, the output magnetic bus 13 has an initial magnetization corresponding to that of the second magnetic bus 12, while the first magnetic bus 11 has an opposite magnetization.

Applying a spin transfer torque may comprise applying a current between the output magnetic bus 13, on one hand, and the first magnetic bus 11 and/or the second magnetic bus 12, on the other hand.

Particularly, generating 105 the stream of domain walls may comprise applying currents along at least two different current paths, e.g., a first path between the first magnetic bus 11 and the output magnetic bus 13 and a second path between the second magnetic bus 12 and the output magnetic bus 13. The magnetization state of the magnetic domain injected into the output magnetic bus 13, e.g., an 'UP' or a 'DOWN' domain or a '−x' or '+x' domain, may thus be determined by whether a current is applied along the first current path or the second current path. For example, applying a current along the first current path may inject an 'UP' domain into the output bus, while applying a current along the second current path may inject a 'DOWN' domain into the output bus. Each of the current paths may share a common segment along the output bus, e.g., due to a source or sink in the output bus that is shared by both current paths, such that a current applied along either current path may be adapted for propagating a sequence of magnetic domains via the output magnetic bus, e.g., away from the central region and through the output magnetic bus.

However, even though an efficient spin transfer torque may be induced by applying an in-plane current, other methods for generating a spin transfer torque or spin orbit torque on domain walls could be utilized within the context of the present disclosure. For example, a spin-orbit torque may be generated to propel the domain wall, which may be advantageously energy efficient. Furthermore, high domain wall propagation speeds may be achieved by combining the application of spin orbit torques with a composite magnetic layer structure of the magnetized propagation layer.

Figure 3:
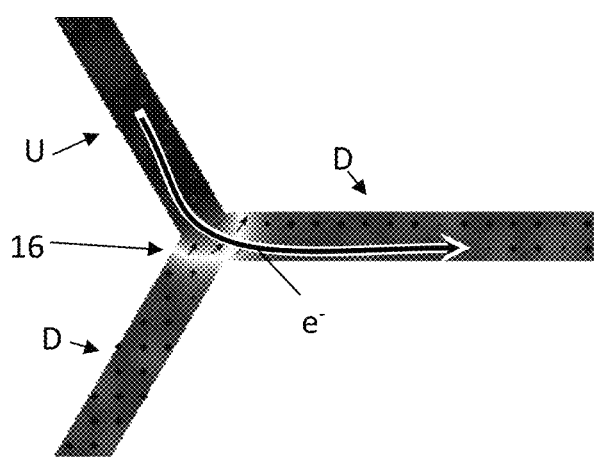
FIG. 3 shows, at a first moment in time, the magnetic domains and domain walls when an electron flow is applied to the device shown in FIG. 2, in accordance with embodiments of the disclosed technology.

For example, in operation, an electron flow e− may be applied such that electrons flow from the first magnetic bus 11 to the output magnetic bus 13, as illustrated in FIG. 3, e.g., a current I may be applied from the output magnetic bus 13 to the first magnetic bus 11. FIG. 2 to FIG. 5 show, progressively, the evolution of the domain wall 16 when such current is applied.

Figure 4:
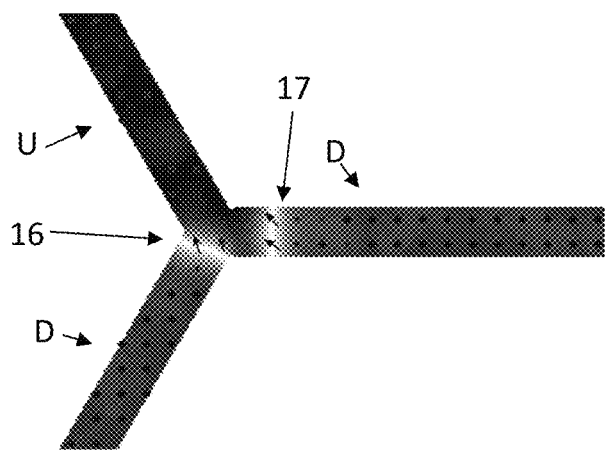
FIG. 4 shows, at a second moment in time following the first moment shown in FIG. 3, the magnetic domains and domain walls when the electron flow is applied to the device shown in FIG. 2, in accordance with embodiments of the disclosed technology.

The applied current may exert a driving force on the domain wall 16, such that the domain wall eventually splits to form a further domain wall 17 propagating along the output magnetic bus 13, while the domain wall 16 remains in the central region, as shown in FIG. 4. Thus, the injected current may move the domain wall from its initial stable position, e.g., shown in FIG. 2, gradually expand the domain wall, e.g., shown in FIG. 3, until it splits into two parts, e.g., as shown in FIG. 4. One part may remain at the junction to be pinned at the other stable position, while the other part of the domain wall may propagate into the output magnetic bus. Therefore, the propagation through the output magnetic bus 13 of the further domain wall 17 that was injected into the output magnetic bus 13 may advantageously also be driven by the same current that is applied to split the further domain wall 17 off the domain wall 16 is the central region.

Figure 5:
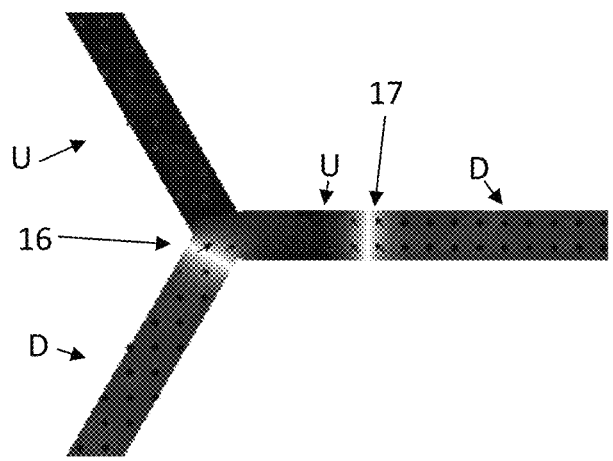
FIG. 5 shows, at a third moment in time following the second moment shown in FIG. 4, the magnetic domains and domain walls when an electron flow is applied to the device shown in FIG. 2, in accordance with embodiments of the disclosed technology.
Figure 9:
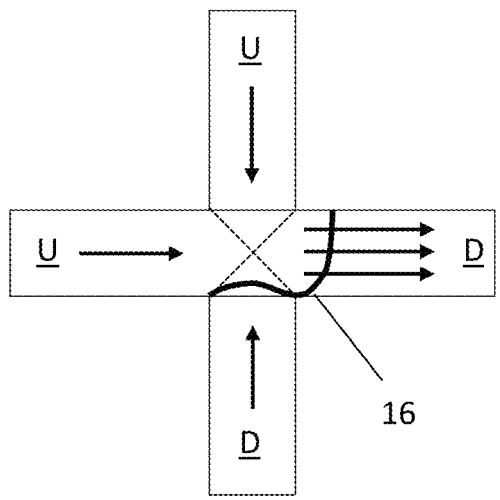
Figure 10:
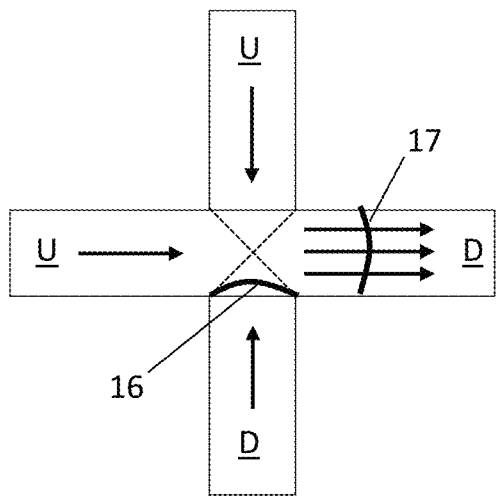
Figure 11:
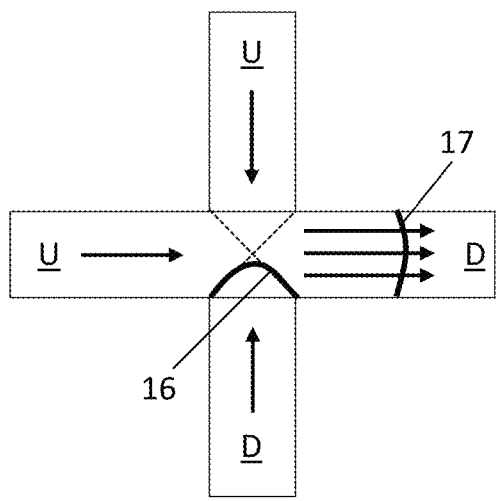
Figure 12:
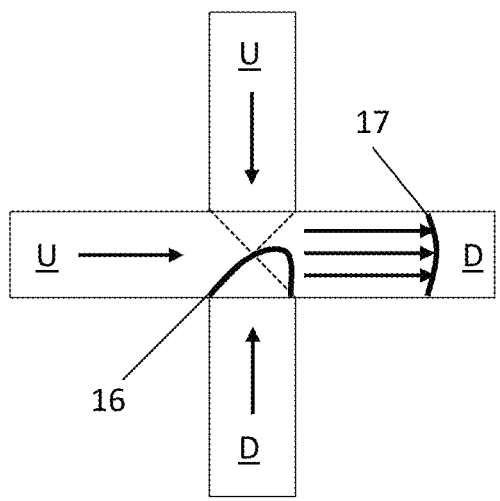
Figures 13, 14:
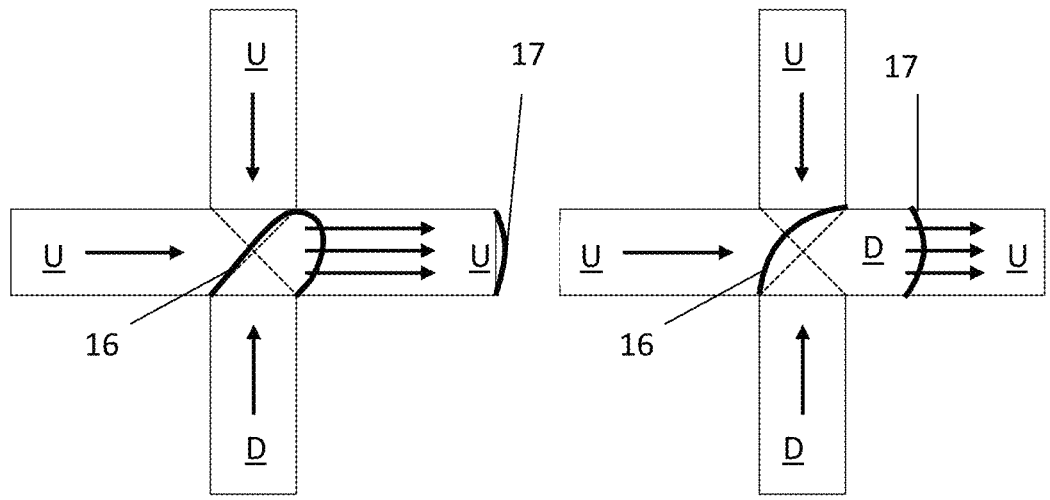
Figures 15, 16:
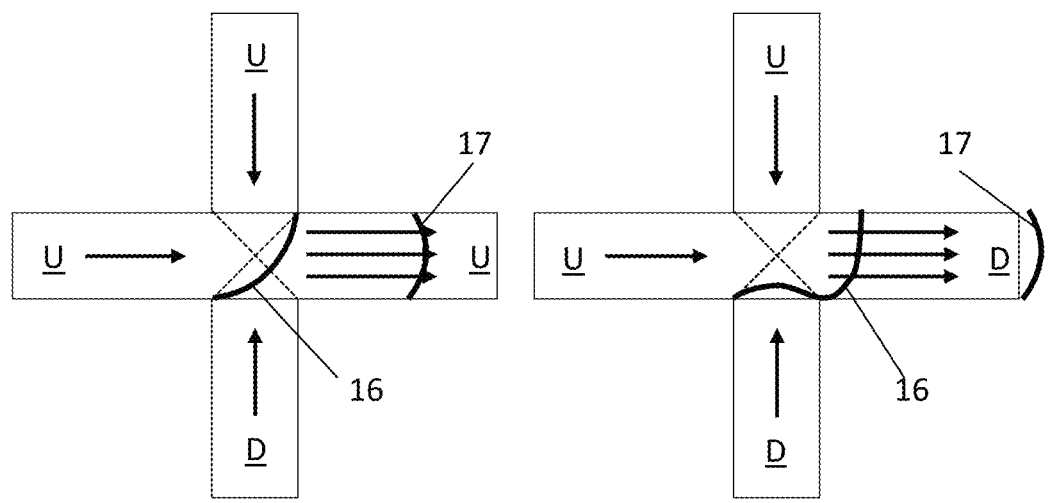

The domain wall 16 in the central region may then reach the other stable configuration. For example, where the first stable configuration may correspond to a magnetization state of the output magnetic bus 13, e.g., at least where it is joined to the central region, that corresponds to that of the second magnetic bus 12, as shown in FIG. 2, the second stable configuration may correspond to a magnetization state of the output magnetic bus 13, e.g., at least where it is joined to the central region, that corresponds to that of the first magnetic bus 11, e.g., as shown in FIG. 5.

Applying the spin orbit torque and/or spin transfer torque may comprise applying a current between the output magnetic bus 13, on one hand, and the first magnetic bus 11 and/or the second magnetic bus 12, on the other hand. For example, an in-plane current may be injected in the first and/or second magnetic bus such as to establish a current path or current paths through the central region toward the output magnetic bus 13, or, alternatively, from the output magnetic bus to the first and/or second magnetic bus for the opposite current sense. Such in-plane current may generate a spin torque on the magnetization, e.g., electrons flowing toward the domain wall to push the domain forward (or, equivalently an opposite polarity current may be applied to push the domain wall forward, depending on the material properties of the magnetic propagation layer in which the magnetic buses are formed).

For example, applying this current may comprise selecting the first magnetic bus 11 or the second magnetic bus 12 to inject the current, in which this selection is determined by a data bit in a data bit sequence to convert into the stream of domain walls to send propagating along the output magnetic bus 13, e.g., determined by a next data bit in the sequence to be sequentially encoded as magnetic domains transmitted via the output magnetic bus.

According to some embodiments, the method may be used to selectively inject magnetic domains into the output magnetic bus, which, for example, may be an input for a spintronic logic device or a racetrack in a racetrack memory. If a current is injected into the first magnetic bus, e.g., one of magnetic buses 11, 12, 18, a domain having the same magnetization as the first magnetic bus may be injected into the output magnetic bus 13, while if a current is injected into the second magnetic bus, e.g., another one of magnetic buses 11, 12, 18, a domain having the same magnetization as the second magnetic bus may be injected into the output magnetic bus 13. Thus, any data sequence can be easily encoded in a stream of 'UP' and 'DOWN' magnetization domains by a synchronized application of the current to the first and second magnetic bus.

Figure 17:
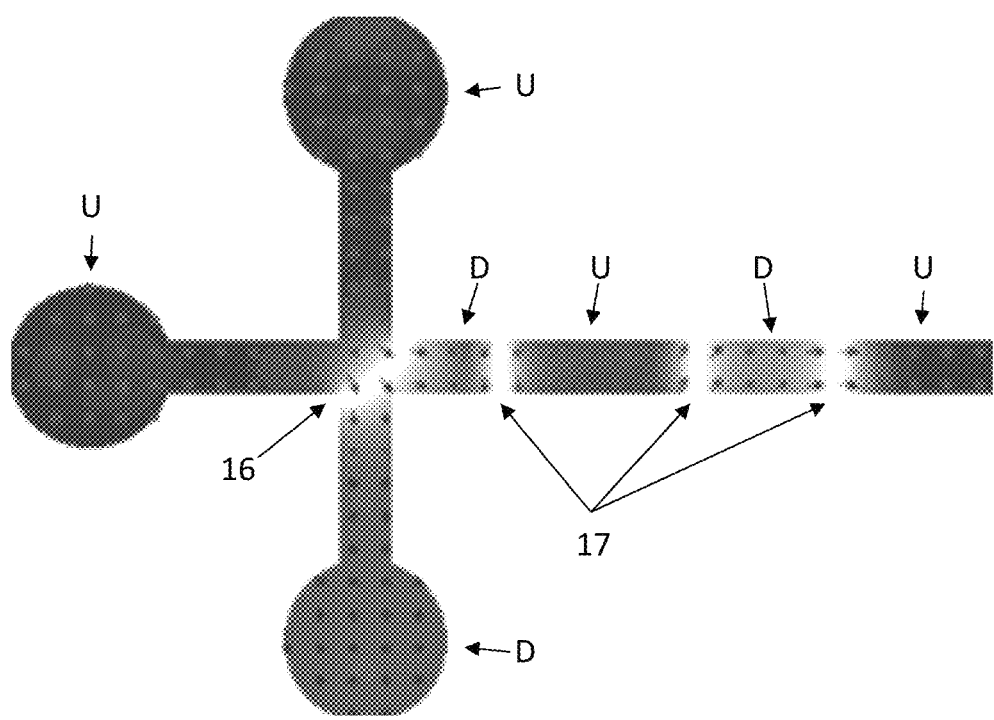
FIG. 17 illustrates a periodic sequence of magnetic domains separated by domain walls generated in a device as shown in FIG. 6 by a method in accordance with embodiments of the disclosed technology.

According to some other embodiments, opposite torques may also be exerted simultaneously on a domain wall, in order to create an oscillation between the two stable configurations. For example, a current may be applied between the output magnetic bus 13, on one hand, and the first magnetic bus 11 and the second magnetic bus 12 (and optionally any or each further magnetic bus 18) on the other hand, such as shown in FIG. 6. For example, in the example shown in FIG. 6, the first magnetic bus 11 and the further magnetic bus 18 may be preset or initialized in a first magnetization state U, e.g., a 'UP' magnetization state, and the second magnetic bus 12 and the output magnetic bus 13 may be preset or initialized in a second magnetization state D different from the first magnetization state, e.g., a transverse 'DOWN' magnetization state. By applying the currents e−, an oscillation between magnetization states of the output magnetic bus 13 can be achieved, thereby periodically generating a domain wall between opposite magnetization states that propagates down the output magnetic bus 13. This is illustrated by FIG. 7 to FIG. 16, chronologically showing the evolution of the domain wall 16 and the further domain wall(s) 17 splitting off the domain wall 16 during a cycle of such oscillation. Thus, a sequence of alternating magnetization domains U, D, separated from each other by a sequence of further domain walls 17, may be achieved in the output magnetic bus, as shown in FIG. 17.

The in-plane currents may generate a spin torque on the magnetization, e.g., electrons flowing toward the domain wall may push it forward. After a small displacement of the domain wall, the net torque may change sign due to the spatial distribution of current. Thus locally reversing the direction in which the domain wall moves. These variations of torques may cause an oscillation when current is applied to both input arms. For some phase of the oscillation, the 'UP' domain may propagate to the output magnetic bus, while for another phase of the oscillation, the 'DOWN' domain may propagate to the output magnetic bus. A domain wall may thus be injected when the orientation of the propagating domain changes. However, while such oscillation may be generated by applying in-plane currents via both input arms simultaneously, in other embodiments in accordance with the disclosed technology, the in-plane current may preferably be selectively applied to either input arm, in order to control the magnetic domain injection.

For example, for each oscillation between the two stable configurations in the central region, a single domain wall may be injected into the output magnetic bus 13. The propagation of injected domain walls through the output magnetic bus 13 may advantageously also be driven by the same injected currents that generate the oscillation in the central region.

While in this example, three currents are simultaneously applied to the first, second and further magnetic bus, further collectively referred to as the input magnetic buses, such as to combine in the output magnetic bus toward a common current sink (or a common current source for the inverse current polarity), embodiments of the disclosed technology are not limited thereto.

Referring back to FIG. 1, the method 100 may further comprise using 108 the generated stream of domain walls propagating along the output magnetic bus 13 to write data to a racetrack memory. Thus the method 100 may be applied for a write scheme for a racetrack memory. For example, the output magnetic bus may be a magnetic domain racetrack.

Figure 21:
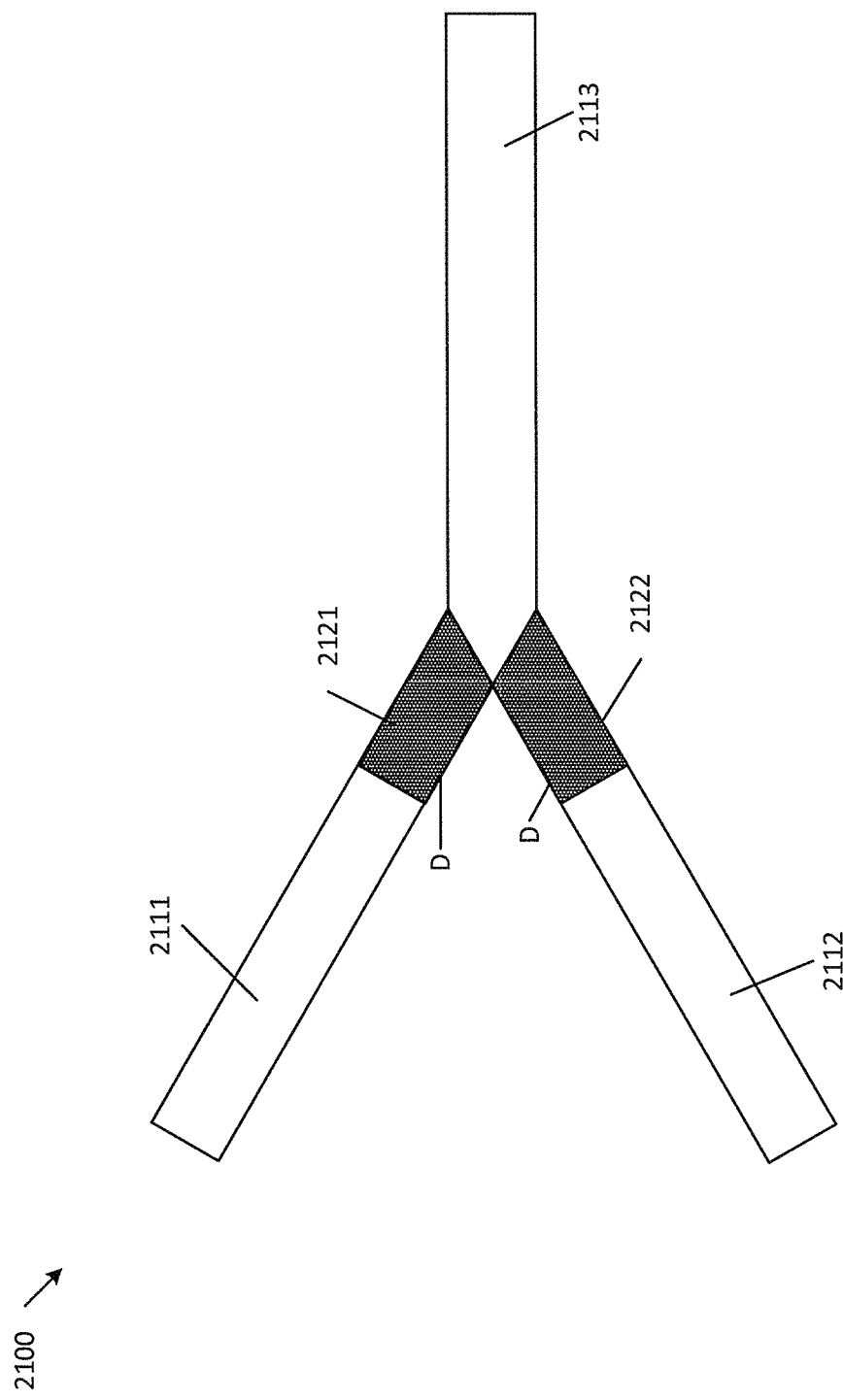
FIG. 21 illustrates an exemplary method in accordance with embodiments of the disclosed technology.

According to further embodiments, a magnetic device can include a first magnetic bus and second magnetic bus having controllable magnetization orientations. FIG. 21 illustrates an exemplary magnetic device having magnetic buses with controllable magnetization orientations. In particular, FIG. 21 illustrates magnetic device 2100, having a first magnetic bus 2111, a second magnetic bus 2112, and an output magnetic bus 2113. The magnetic buses can be oriented, for example, as described above with respect to FIG. 2, and may further include an adjoining region in which the magnetic buses converge. Further, as described above, magnetic device 2100 may be provided as part of a magnetic propagation layer.

Magnetic device 2100 may include a first input 2121 configured to control a magnetization orientation of first magnetic bus 2111 and a second input 2122 configured to control a magnetization orientation of second magnetic bus 2112. For instance, the magnetization orientations of first magnetic bus 2111 and second magnetic bus 2112 can be controlled by applying spin orbit torques and/or spin transfer torques by way of first input 2121 and second input 2122 respectively. It will be understood that the magnetization orientations of first magnetic bus 2111 and second magnetic bus 2112 can be controlled in other ways as well. In this fashion, first magnetic bus 2111 and second magnetic bus 2112 can each be oriented in two or more magnetic orientations. In the present example, first magnetic bus 2111 and second magnetic bus 2112 are depicted as being oriented in a 'DOWN' state.

A magnetization state of a domain wall injected into output magnetic bus 2113 may correspond to a logical '0' or '1.' For example, a 'DOWN' magnetic state may correspond to a '0,' and an 'UP' magnetic state may correspond to a '1.' Thus, an injected domain wall can correspond to a '0' or a '1' based on which magnetic bus, first magnetic bus 2111 or second magnetic bus 2112, is selected, and based on the magnetic orientation of the magnetic bus at the time of selection. In this fashion, output magnetic bus 2113 may provide a single output for multiple inputs that correspond to a '0' or a '1.' Thus, FIG. 21 provides an example of a magnetic device 2100 that operates as a multiplexer.

Magnetic device 2100 may serve as a logic element within a logic circuit. For instance, first magnetic bus 2111, second magnetic bus 2112, and/or output magnetic bus 2113 may be connected to other portions of the logic circuit, allowing for a logic circuit to exist on the same magnetic propagation layer on which magnetic device 2100 is provided.

Figure 22:
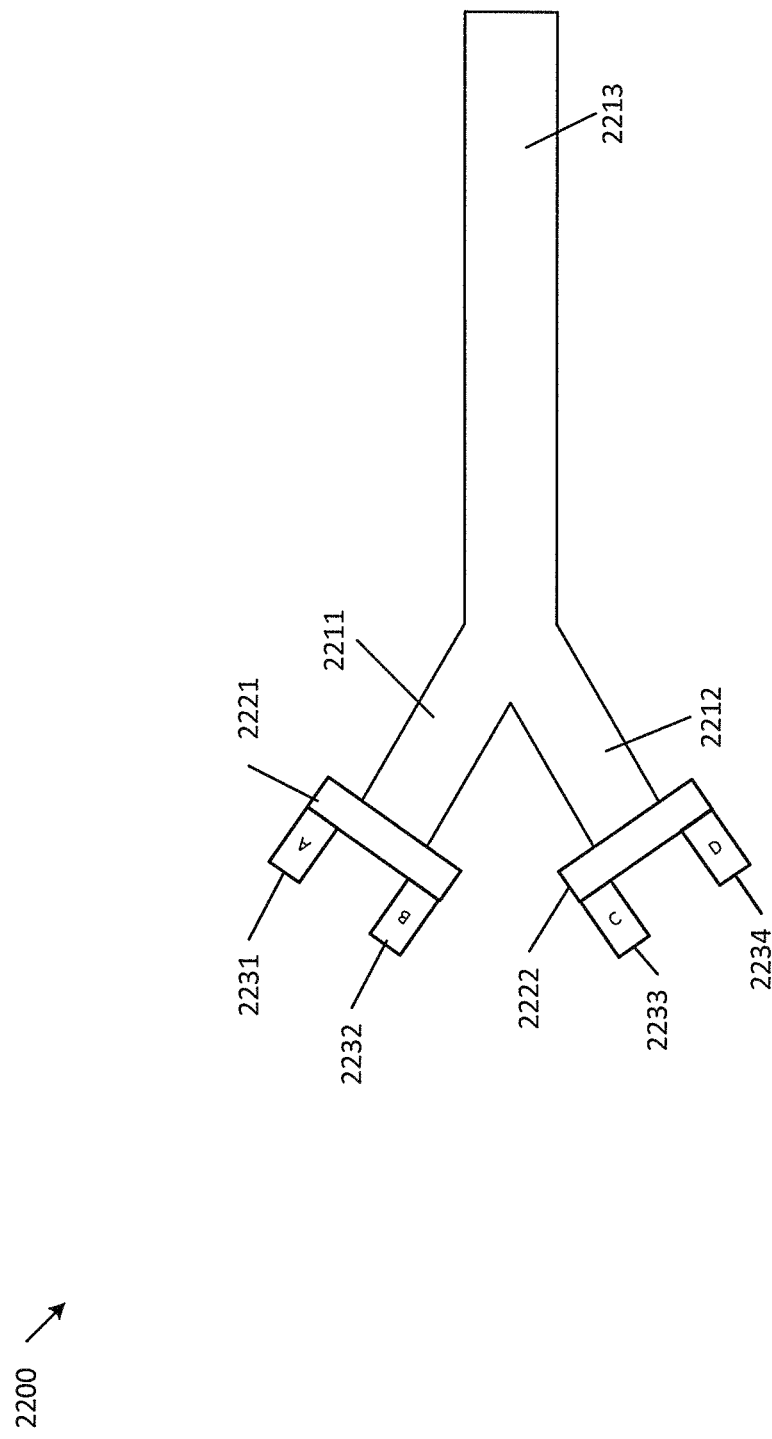
FIG. 22 illustrates a further exemplary device that may be provided in a method in accordance with embodiments of the disclosed technology.

FIG. 22 illustrates another exemplary magnetic device having magnetic buses with controllable magnetization orientations. Illustrated magnetic device 2200 includes first magnetic bus 2211, second magnetic bus 2212, and output magnetic bus 2213. Magnetic device 2200 further includes a first input 2221 and second input 2222 which respectively control a magnetic orientation of first magnetic bus 2211 and second magnetic bus 2212. In the present example, inputs 2221 and 2222 may include a charge-to-spin converter. For example, inputs 2221 and/or 2222 can use a Magnetic Tunnel Junction, an SOT device, or a magnetoelectric cell to control the magnetic orientation of first magnetic buses 2211 and 2212. Each charge-to-spin converter may include control terminals. For example, first input 2221 includes terminals 2231 (labelled 'A' in FIG. 22) and 2232 (labelled 'B') and second input 2222 includes terminals 2233 (labelled 'C') and 2234 (labelled 'D'). Applying current between terminals A 2231 and B 2232 or C 2233 and D 2234 will power a charge-to-spin conversion that controls the orientation of magnetic buses 2211 and 2212 respectively.

In the present example, selecting first magnetic bus 2211 may include applying a current between terminal A 2231 or terminal B 2232 and output magnetic bus 2213. Similarly, selecting second magnetic bus 2212 may include applying a current between terminal C 2233 or terminal D 2234 and output magnetic bus 2213. Such an applied current may be referred to as a "selection signal," and may flow between first magnetic bus 2211 and output magnetic bus 2213 or between second magnetic bus 2212 and output magnetic bus 2213.

Figure 23A:
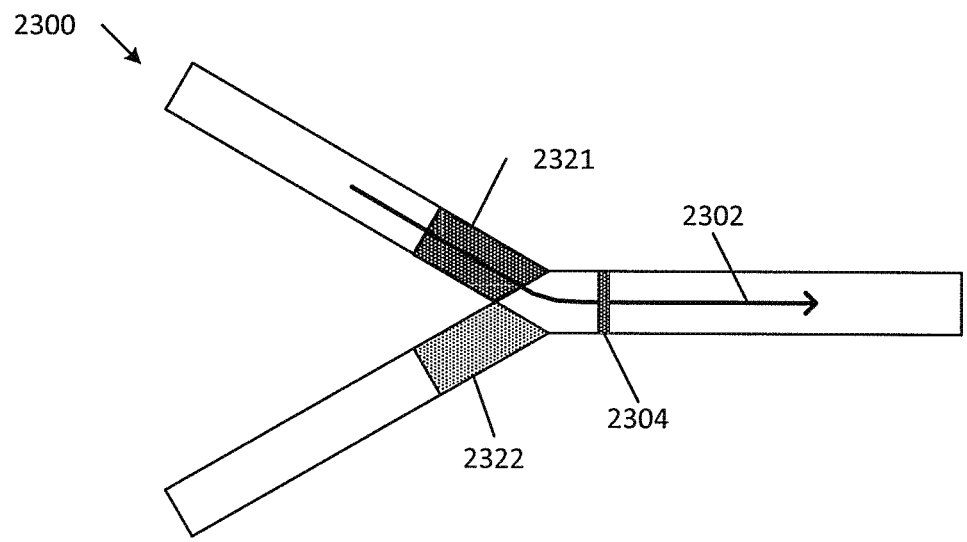
FIG. 23A and FIG. 23B illustrate generation of domain walls propagating down the output magnetic bus in a device as shown in FIG. 21.
Figure 23B:
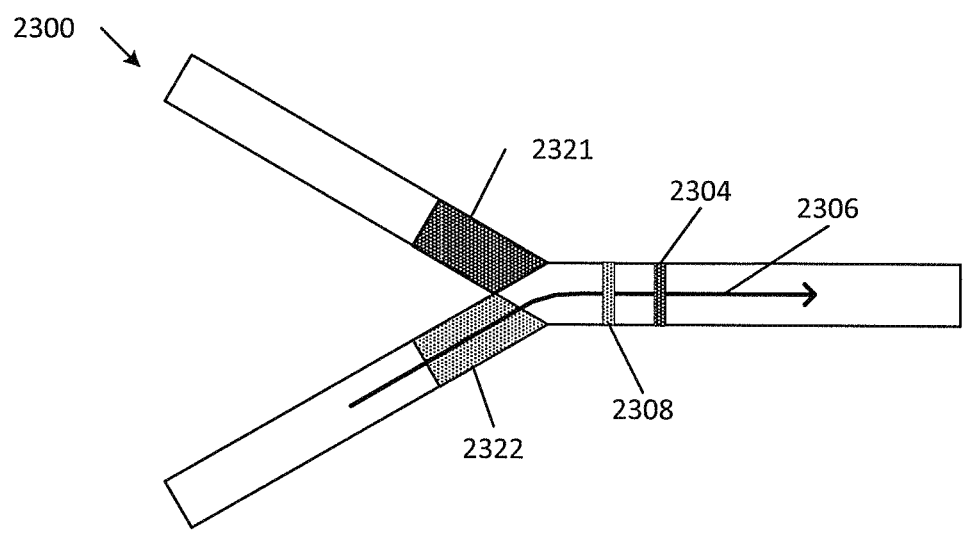

FIG. 23A and FIG. 23B illustrate generation of domain walls propagating down the output magnetic bus in a device as shown in FIG. 21. FIG. 23A shows magnetic device 2300 having a first magnetic bus, a second magnetic bus, and an output bus. A selection signal 2302 is also depicted as being applied between the first magnetic bus and the output magnetic bus. Selection signal 2302 can be, for example, a current applied between the first magnetic bus and the output bus.

FIG. 23A further illustrates a domain wall 2304, which propagates along the output magnetic bus as a result of selection signal 2302 being applied. First input 2321 is depicted as controlling the first magnetic bus such that the first magnetic bus is in a 'DOWN' magnetic state. Second input 2322 is depicted as controlling the second magnetic bus such that the second magnetic bus is also in an 'UP' magnetic state. Because selection signal 2302 is depicted as selecting the first magnetic input and because first input 2321 is in a 'DOWN' magnetic state, domain wall is also in a 'DOWN' magnetic state.

FIG. 23B depicts a domain wall 2308, which propagates along the output magnetic bus as a result of a second selection signal 2306 being applied between the second magnetic bus and the output magnetic bus. First input 2321 is depicted as controlling the first magnetic bus such that the first magnetic bus is in a 'DOWN' magnetic state. Second input 2322 is depicted as controlling the second magnetic bus such that the second magnetic bus is also in a 'UP' magnetic state. Because second selection signal 2306 is depicted as selecting the second magnetic input and because second input 2322 is in an 'UP' magnetic state, domain wall 2308 is also in an 'UP' magnetic state. When the first magnetic bus and second magnetic bus are controlled to have opposite magnetic orientations, magnetic device 2300 will operate substantially as described above with respect to FIG. 1.

As described above with respect to magnetic devices 2100 and 2200, illustrated in FIG. 21 and FIG. 22 respectively, controlling the magnetic orientation of the first magnetic bus and the second magnetic bus allows the magnetic device to operate as a multiplexer. FIG. 24 illustrates a logic diagram that shows the operation of the magnetic multiplexer. The diagram shows that, when the first input (e.g. first input 2321 depicted in FIG. 23A) and the second input (e.g. second input 2322 depicted in FIG. 23A) control the first and second magnetic buses such that both magnetic buses are in the same magnetic state, the resulting domain wall will also share that magnetic state. The diagram also shows that, when the first input (e.g. first input 2321 depicted in FIG. 23B) and the second input (e.g. second input 2322 depicted in FIG. 23B) control the first and second magnetic buses such that both magnetic buses are in a different magnetic state, the resulting domain wall will share the same magnetic orientation as whichever magnetic bus that is selected by the selection signal.

Figure 25:
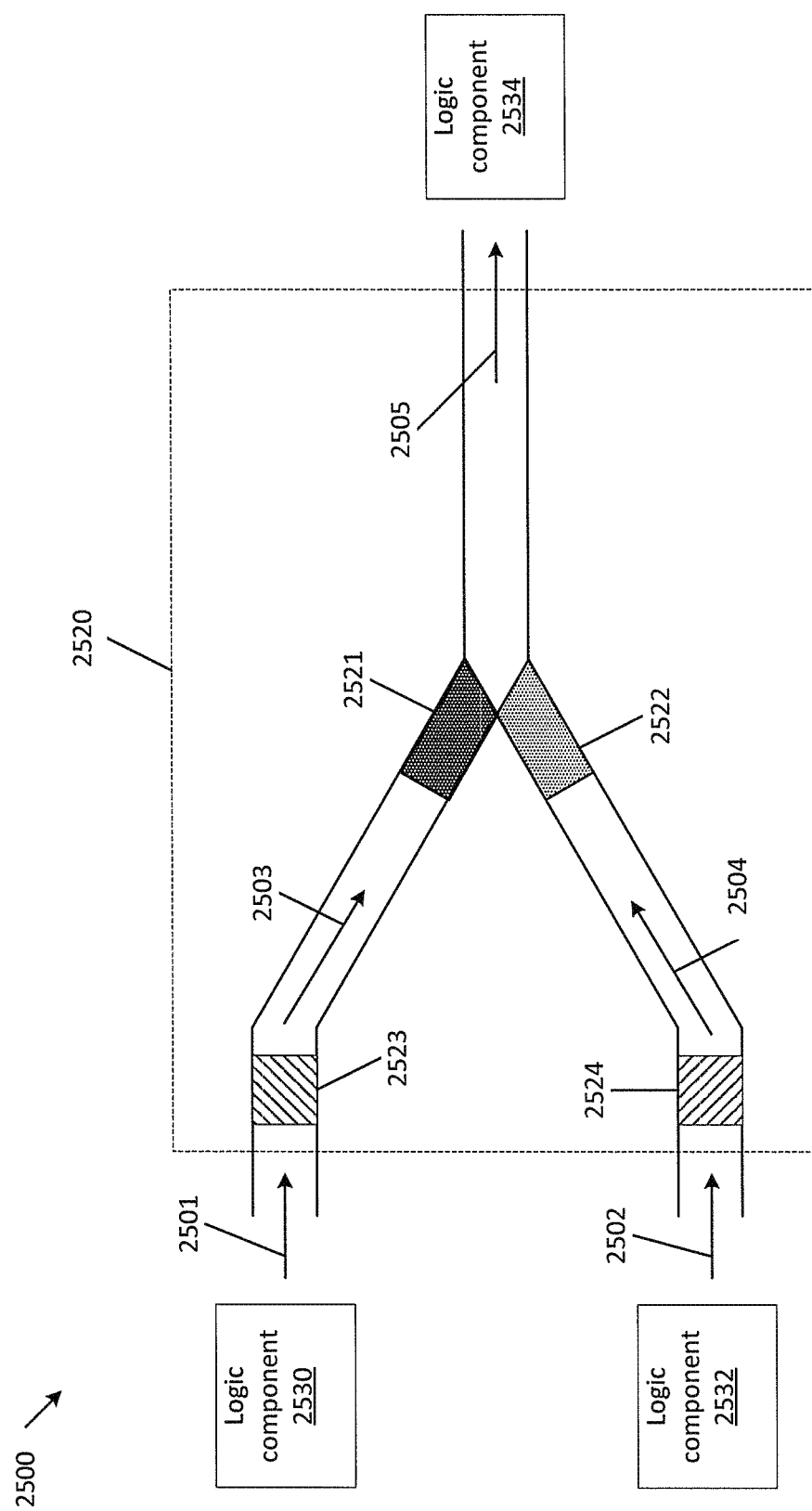
FIG. 25 illustrates a further exemplary device that may be provided in a method in accordance with embodiments of the disclosed technology.

FIG. 25 illustrates another magnetic device configured to interact with logic components in a magnetic propagation layer 2500. Illustrated magnetic device 2520 is depicted as receiving control signals 2501 and 2502 from logic component 2530 and logic component 2532 respectively, and transmitting output signal 2505 to logic component 2534.

FIG. 25 shows that, as is the case with other multiplexers, the magnetic device described herein can be connected to other logic elements, such as AND, NOT, OR, XOR, or other logic gates, in a logic circuit to result in a desired logic output. In these embodiments, the magnetic device might operate in accordance with other elements in the logic circuit. For example, a clock signal may be provided such that controlling the magnetization orientations of the first and second magnetic buses is performed periodically at a first rate, and such that the selection signals are provided periodically at a second rate. Further, the magnetic device may receive and send logic signals to other logic elements in the circuit. In some embodiments, such logic elements may also be magnetically implemented. In such examples, the received signals, such as control signals 2501 and 2502 may include a stream of domain walls that propagate from another magnetic device, and selection signal drivers 2523 and 2524 may responsively drive selection signals 2503 and 2504. In other embodiments, a combination of magnetic and electronic elements may be used in the logic circuit.

Magnetic device 2520 can drive selection signals 2503 and 2504 based on received control signals 2501 and 2502 respectively. For instance, a first selection signal driver 2523 corresponding to a first magnetic bus may receive a control signal 2501 from logic component 2530 and responsively drive a selection signal 2503 between the first magnetic bus and an output magnetic bus of magnetic device 2520. Similarly, a second selection signal driver 2524 corresponding to a second magnetic bus may receive control signal 2502 from logic component 2530 and responsively drive a selection signal 2504 between the second magnetic bus and the output bus of magnetic device 2520.

Similar to the magnetic devices described above with respect to FIGS. 21, 22, 23A, and 23B, magnetic device 2520 includes independently controllable inputs 2521 and 2522. Input 2521 controls a magnetization state of the first magnetic bus and input 2522 controls the magnetization state of the second magnetic bus. In the present example, input 2521 is depicted as controlling the first magnetic bus such that the first magnetic bus is in a 'DOWN' magnetic state and input 2522 is depicted as controlling the second magnetic bus such that the second magnetic bus is in an 'UP' magnetic state. However, these magnetization states may change over time.

Thus, within magnetic propagation layer 2500, magnetic device 2520 may receive control signals from logic components 2530 and 2532 over time that cause output signal 2505 to be sent to logic component 2534. Output signal 2505 can include a stream of domain walls that propagate along the output magnetic bus towards logic component 2534.

First input 2521 and second input 2522 may control magnetization states of the first and second magnetic buses independently from each other and independently from logic components 2530 and 2532. For example, inputs 2521 and 2522 may each receive signals from separate logic components or controllers, and may control magnetic orientations of the first and second magnetic buses based on the received signals. In other examples, inputs 2521 and 2522 may be controlled by a common controller or may be operated in accordance with logic components 2530 and 2532. For instance, first input 2521 may control the magnetic orientation of the first magnetic bus at or near the same time that control signal 2501 is received by first selection signal driver 2523, and second input 2522 may control the magnetic orientation of the second magnetic bus at or near the same time that control signal 2502 is received by second selection signal driver 2524.

Figure 26:
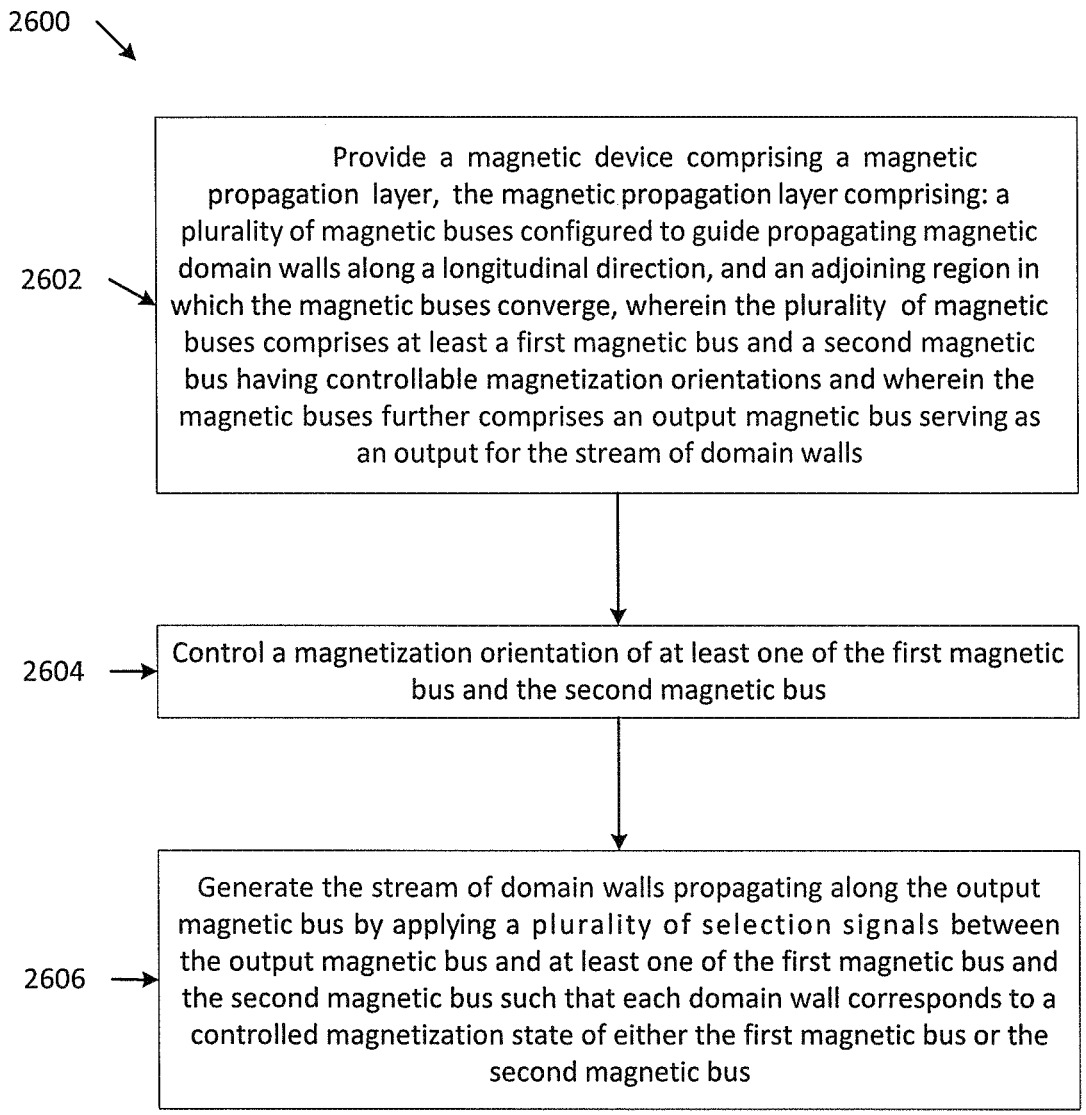
FIG. 26 illustrates an exemplary method in accordance with embodiments of the disclosed technology.

FIG. 26 illustrates an exemplary method 2600 in accordance with embodiments of the disclosed technology, and may apply to magnetic devices described above, such as those illustrated in FIG. 21, FIG. 22, 23, and/or FIG. 25.

Method 2600 includes block 2602, which may be performed to provide a magnetic device comprising a magnetic propagation layer. The magnetic propagation layer can include a plurality of magnetic buses configured to guide propagating magnetic domain walls along a longitudinal direction, and an adjoining region in which the magnetic buses converge. The plurality of magnetic buses may include at least a first magnetic bus and a second magnetic bus having controllable magnetization orientations. The magnetic buses may further include an output magnetic bus serving as an output for the stream of domain walls.

Method 2600 further includes block 2604, which may be performed to control a magnetization orientation of at least one of the first magnetic bus and the second magnetic bus. In some embodiments, controlling the magnetization orientation of at least one of the first magnetic bus and the second magnetic bus may include providing magnetic interconnections between at least one logic element in the magnetic propagation layer and the first magnetic bus and the second magnetic bus. In such embodiments, the at least one logic element may be configured to control the magnetization orientation of the first magnetic bus and the second magnetic bus. In additional embodiments, controlling the magnetization orientation of at least one of the first magnetic bus and the second magnetic bus may include providing charge-to-spin converters corresponding to each of the first magnetic bus and the second magnetic bus. In such embodiments, the charge-to-spin converters are configured to control the magnetization orientation of the first magnetic bus and the second magnetic bus.

In some embodiments, method 2600 may additionally include providing a clock signal. In these embodiments, controlling the magnetization orientation of at least one of the first magnetic bus and the second magnetic bus can be performed in accordance with the clock signal, and applying the plurality of selection signals is performed in accordance with the clock signal.

Method 2600 additionally includes block 2606, which may be performed to generate the stream of domain walls propagating along the output magnetic bus by applying a plurality of selection signals between the output magnetic bus and at least one of the first magnetic bus and the second magnetic bus such that each domain wall corresponds to a controlled magnetization state of either the first magnetic bus or the second magnetic bus. In some embodiments, applying each selection signal of the plurality of selection signals may include applying an in-plane current between the output magnetic bus and one or both of the first magnetic bus, such as to establish at least one current path through the adjoining region toward the output magnetic bus.

In some embodiments, the plurality of magnetic buses can collectively operate as a multiplexer. In such embodiments, method 2600 may further include providing at least one other logic element in the magnetic propagation layer. The at least one other logic element interacts with the plurality of magnetic buses in accordance with a desired logic output.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of generating a stream of domain walls in a magnetic device, the method comprising:
    providing a magnetic device comprising a magnetic propagation layer, the magnetic propagation layer comprising:
        a plurality of magnetic buses configured to guide propagating magnetic domain walls along a longitudinal direction, and
        an adjoining region in which the magnetic buses converge, and
        wherein the plurality of magnetic buses comprises at least a first magnetic bus and a second magnetic bus
        wherein the magnetic buses further comprises an output magnetic bus serving as an output for the stream of domain walls;
    generating the stream of domain walls propagating along the output magnetic bus by applying one or both of a spin orbit torque (SOT) and a spin transfer torque (STT) to the pinned domain wall such as to alternate the pinned domain wall between two stable configurations, in which each stable configuration corresponds to a different magnetization state of the output magnetic bus in at least a region where the output magnetic bus is joined to the adjoining region in which the plurality of magnetic buses converge and are joined together.

2. The method of claim 1, wherein, at a given time, the first magnetic bus and the second magnetic bus have opposite magnetization orientations with respect to each other, and wherein, at the given time, a domain wall separating the opposite magnetization states is pinned in the adjoining region.

3. The method of claim 2, further comprising initializing at least the first magnetic bus and the second magnetic bus in the opposite magnetization orientations with respect to each other.

4. The method of claim 3, wherein initializing further comprises initializing at least a further magnetic bus to either of the opposite magnetization orientations.

5. The method of claim 1, wherein applying one or both of the SOT and the STT comprises applying an in-plane current between the output magnetic bus and one or both of the first magnetic bus and the second magnetic bus, such as to establish at least one current path through the adjoining region toward the output magnetic bus.

6. The method of claim 5, wherein applying the in-plane current comprises selecting one of the first magnetic bus or the second magnetic bus for injecting the in-plane current, wherein the selection is determined by a data bit in a data bit sequence converted into the stream of domain walls.

7. The method of claim 1, wherein the output magnetic bus serves as a racetrack memory.

8. The method of claim 1, wherein the plurality of magnetic buses collectively serve as a multiplexer.

9. The method of claim 1, wherein the first magnetic bus and the second magnetic bus have controllable magnetization orientations, the method further comprising:
    controlling a magnetization orientation of at least one of the first magnetic bus and the second magnetic bus, wherein generating the stream of domain walls comprises applying a plurality of selection signals between the output magnetic bus and at least one of the first magnetic bus and the second magnetic bus such that each domain wall corresponds to a controlled magnetization state of either the first magnetic bus or the second magnetic bus.

10. A method of generating a stream of domain walls in a magnetic device, the method comprising:
   providing a magnetic device comprising a magnetic propagation layer, the magnetic propagation layer comprising:
      a plurality of magnetic buses configured to guide propagating magnetic domain walls along a longitudinal direction, and
      an adjoining region in which the magnetic buses converge,
      wherein the plurality of magnetic buses comprises at least a first magnetic bus and a second magnetic bus having controllable magnetization orientations, and
      wherein the magnetic buses further comprises an output magnetic bus serving as an output for the stream of domain walls;
   controlling a magnetization orientation of at least one of the first magnetic bus and the second magnetic bus; and
   generating the stream of domain walls propagating along the output magnetic bus by applying a plurality of selection signals between the output magnetic bus and at least one of the first magnetic bus and the second magnetic bus such that each domain wall corresponds to a controlled magnetization state of either the first magnetic bus or the second magnetic bus.

11. The method of claim 10, further comprising:
   providing a clock signal, wherein controlling the magnetization orientation of at least one of the first magnetic bus and the second magnetic bus is performed in accordance with the clock signal, and wherein applying the plurality of selection signals is performed in accordance with the clock signal.

12. The method of claim 10, wherein controlling the magnetization orientation of at least one of the first magnetic bus and the second magnetic bus comprises providing magnetic interconnections between at least one logic element in the magnetic propagation layer and the first magnetic bus and the second magnetic bus, wherein the at least one logic element is configured to control the magnetization orientation of the first magnetic bus and the second magnetic bus.

13. The method of claim 10, wherein controlling the magnetization orientation of at least one of the first magnetic bus and the second magnetic bus comprises providing charge-to-spin converters corresponding to each of the first magnetic bus and the second magnetic bus, wherein the charge-to-spin converters are configured to control the magnetization orientation of the first magnetic bus and the second magnetic bus.

14. The method of claim 10, wherein applying each selection signal of the plurality of selection signals comprises applying an in-plane current between the output magnetic bus and one or both of the first magnetic bus, such as to establish at least one current path through the adjoining region toward the output magnetic bus.

15. The method of claim 10, wherein the plurality of magnetic buses collectively operate as a multiplexer, the method further comprising:
   providing at least one other logic element in the magnetic propagation layer, wherein the at least one other logic element interacts with the plurality of magnetic buses in accordance with a desired logic output.

16. A system comprising:
   a magnetic device, wherein the magnetic device comprises:
      a plurality of magnetic buses configured to guide a stream of propagating magnetic domain walls along a longitudinal direction, wherein the plurality of magnetic buses comprises at least a first magnetic bus and a second magnetic bus having controllable magnetization orientations, and an output magnetic bus serving as an output for the stream of domain walls; and
      an adjoining region in which the magnetic buses converge;
      wherein the first magnetic bus, the second magnetic bus, and the output magnetic bus are configured to generate the stream of domain walls propagating along the output magnetic bus in accordance with a plurality of selection signals between the output magnetic bus and at least one of the first magnetic bus and the second magnetic bus such that each domain wall corresponds to a controlled magnetization state of either the first magnetic bus or the second magnetic bus.

17. The system of claim 16, wherein the magnetic device operates as a multiplexer, the system further comprising:
   at least one other logic device, wherein the at least one other logic element interacts with the plurality of magnetic buses in accordance with a desired logic output.

18. The system of claim 16, further comprising a clock configured to provide a clock signal, wherein the magnetization orientations of the first magnetic bus and the second magnetic bus are controllable in accordance with the clock signal.

19. The system of claim 16, further comprising:
   a first charge-to-spin converter and a second charge-to-spin converter corresponding to the first magnetic bus and the second magnetic bus respectively, wherein the first charge-to-spin converter is configured to control the magnetization orientation of the first magnetic bus, and wherein the second charge-to-spin converter is configured to control the magnetization orientation of the second magnetic bus.

20. The system of claim 19, wherein the first charge-to-spin converter and the second charge-to-spin converter each comprise a Magnetic Tunnel Junction, a spin-orbit torque (SOT) device, or a magnetoelectric cell.

* * * * *